(12) United States Patent
Shima

(10) Patent No.: US 8,067,291 B2
(45) Date of Patent: Nov. 29, 2011

(54) MOS FIELD-EFFECT TRANSISTOR AND MANUFACTURING METHOD THEREOF

(75) Inventor: Masashi Shima, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 169 days.

(21) Appl. No.: 11/717,204

(22) Filed: Mar. 13, 2007

(65) Prior Publication Data
US 2007/0152277 A1 Jul. 5, 2007

Related U.S. Application Data

(63) Continuation of application No. PCT/JP2004/013531, filed on Sep. 16, 2004.

(51) Int. Cl.
*H01L 21/76* (2006.01)

(52) U.S. Cl. ........ 438/421; 438/739; 438/214; 438/282; 438/411

(58) Field of Classification Search .................. 438/739, 438/214.281, 411, 421; 257/197
See application file for complete search history.

(56) References Cited

U.S. PATENT DOCUMENTS

| | | | | |
|---|---|---|---|---|
| 6,724,660 B2* | 4/2004 | Skotnicki et al. | ........ | 365/185.27 |
| 6,815,310 B2* | 11/2004 | Roberds et al. | ............... | 438/421 |
| 6,881,635 B1* | 4/2005 | Chidambarrao et al. | ..... | 438/300 |
| 6,964,911 B2* | 11/2005 | Orlowski et al. | ............. | 438/400 |
| 7,057,216 B2* | 6/2006 | Ouyang et al. | ................. | 257/194 |
| 7,605,025 B2* | 10/2009 | Kim et al. | ...................... | 438/151 |
| 2003/0173617 A1* | 9/2003 | Sato et al. | ...................... | 257/327 |
| 2004/0212035 A1* | 10/2004 | Yeo et al. | ....................... | 257/510 |

FOREIGN PATENT DOCUMENTS

| | | |
|---|---|---|
| JP | 9-321307 A | 12/1997 |
| JP | 2001-332745 A | 11/2001 |
| JP | 2002-93921 A | 3/2002 |
| JP | 2002-100762 A | 4/2002 |
| JP | 2003-45996 A | 2/2003 |
| JP | 2003-92399 A | 3/2003 |

OTHER PUBLICATIONS

International Search Report of PCT/JP2004/013531, date of mailing Dec. 7, 2004.

* cited by examiner

*Primary Examiner* — Thanh V Pham
*Assistant Examiner* — Caleb Henry
(74) *Attorney, Agent, or Firm* — Westerman, Hattori, Daniels & Adrian, LLP

(57) ABSTRACT

To provide a manufacturing method of a MOS field-effect transistor in which such a structure is adopted that SiGe having a large lattice constant is embedded immediately below a channel and distortion is effectively introduced in a channel Si layer so that mobility of electrons or holes are drastically improved, thereby realizing high-speed operation and low power consumption. A stressor 2 composed of silicon germanium is formed in a portion in an active region that is separated by an insulating film formed on a silicon substrate, a silicon channel layer 1 composed of silicon is formed above the stressor, and a tensile stress layer 10 is formed so as to surround a gate electrode and a sidewall formed on the gate electrode.

8 Claims, 11 Drawing Sheets

Inside contact eting-stop layer

US 8,067,291 B2

MOS FIELD-EFFECT TRANSISTOR AND MANUFACTURING METHOD THEREOF

BACKGROUND OF THE INVENTION

1) Field of the Invention

The present invention relates to a metal-oxide semiconductor (MOS) field-effect transistor in which distortion is applied to one of semiconductor layers in a heterojunction structure that is formed with two different types of semiconductor layers having different lattice constants, and a manufacturing method thereof.

2) Description of the Related Art

Conventionally, improvement in performance of MOS field-effect transistors has been achieved through microstructuring. In recent years, MOS field-effect transistors of higher performance that are capable of high-speed operation with low leakage current are demanded for high-speed processing in information processing and data communication, and for low power consumption. However, the microstructuring of the MOS field-effect transistors in accordance with the conventional scaling law are approaching the limit thereof.

As one method of achieving high-speed operation, it has been known that distortion is introduced to channels to change the properties of a material of the channels, thereby improving electron mobility.

For example, in techniques disclosed in Japanese Patent Application Laid-open Nos. H9-321307 and 2001-332745, silicon (Si) is laminated on a relaxed silicon-germanium (SiGe) layer, and large distortion is added thereto. Thus, electron mobility is greatly improved, thereby drastically improving properties of nMOS field-effect transistors.

Moreover, in a technique disclosed in Japanese Patent Application Laid-open No. 2002-93921, a stress is generated in a gate electrode to apply to a channel region of a silicon substrate. Thus, channel properties of MOS field-effect transistors are improved without using the distorted silicon substrate.

However, with any of the conventional techniques, it is difficult to achieve improvement both in terms of manufacturing costs and of properties of high-speed operation and low power consumption.

In view of the above problems, it is an object of the present invention to provide a manufacturing method of a MOS field-effect transistor in which such a structure is adopted that SiGe having a large lattice constant is embedded immediately below a channel and distortion is effectively introduced in a channel Si layer so that mobility of electrons and holes are drastically improved, thereby realizing high-speed operation and low power consumption.

Furthermore, it is an object of the present invention to provide a MOS field-effect transistor that is advantageous in terms of costs by this manufacturing method of a MOS field-effect transistor, maintaining high consistency with existing processes without drastically changing the processes.

SUMMARY OF THE INVENTION

To solve the above problems, the present invention is characterized by the followings.

In a manufacturing method of a MOS field-effect transistor according to the present invention, a stressor composed of a compound having a lattice constant different from that of silicon in a portion inside an active region that is separated by an insulating film formed on a silicon substrate, and a silicon channel is formed with silicon above the stressor.

Moreover, a MOS field-effect transistor according to the present invention includes a stressor that is composed of a compound having a lattice constant different from that of silicon in a portion inside an active region that is separated by an insulating film formed on a silicon substrate, and a silicon channel layer formed with silicon arranged above the stressor.

BRIEF DESCRIPTION OF THE DRAWINGS

FIG. 6A shows a state where a gate insulating film and a gate electrode are formed in an Si/SiGe layer structure, FIG. 6B shows a state where a source/drain region is etched, and FIG. 6C shows a state where Si is filled back by the CVD;

FIG. 7D shows a state where a sidewall is formed after extension is implanted, FIG. 7E shows a state where a contact etching-stop layer is formed, and FIG. 7F shows a state where an interlayer insulating film is formed, a contact hole is opened, and an electrode is formed;

FIG. 8A shows a state where the gate insulating film and the gate electrode are formed in the Si/SiGe layer structure, FIG. 8B shows a state where the source/drain region is etched, using the gate and the sidewall as a mask, and FIG. 8C shows a state where Si is filled back by a CVD method;

FIG. 9D shows a state where the sidewall is formed after extension is implanted, FIG. 9E shows a state where a contact etching-stop layer is formed over the silicide, and FIG. 9F shows a state where the interlayer insulating film is formed, the contact hole is opened, and the electrode is formed;

FIG. 10B shows a state where the source/drain region is etched, using the gate and the sidewall as a mask, FIG. 10B' shows a state where a part of the SiGe layer is selectively etched, FIG. 11B shows a state where the source/drain region is etched, FIG. 11B' shows a state where the SiGe layer is removed by selective etching.

DETAILED DESCRIPTIONS

Exemplary embodiments of the present invention will be explained below with reference to the accompanying drawings. Note that the explanations below will only exemplify the embodiments of the invention, and other embodiments will readily occur to those skilled in the art through changes and modifications of the invention within the spirit or scope of the present invention. Therefore, the following explanations are not intended to limit the scope of the invention.

A principle of a MOS field-effect transistor according to an embodiment of the present invention will be explained with reference to FIGS. 1 to 5.

Figure 1:
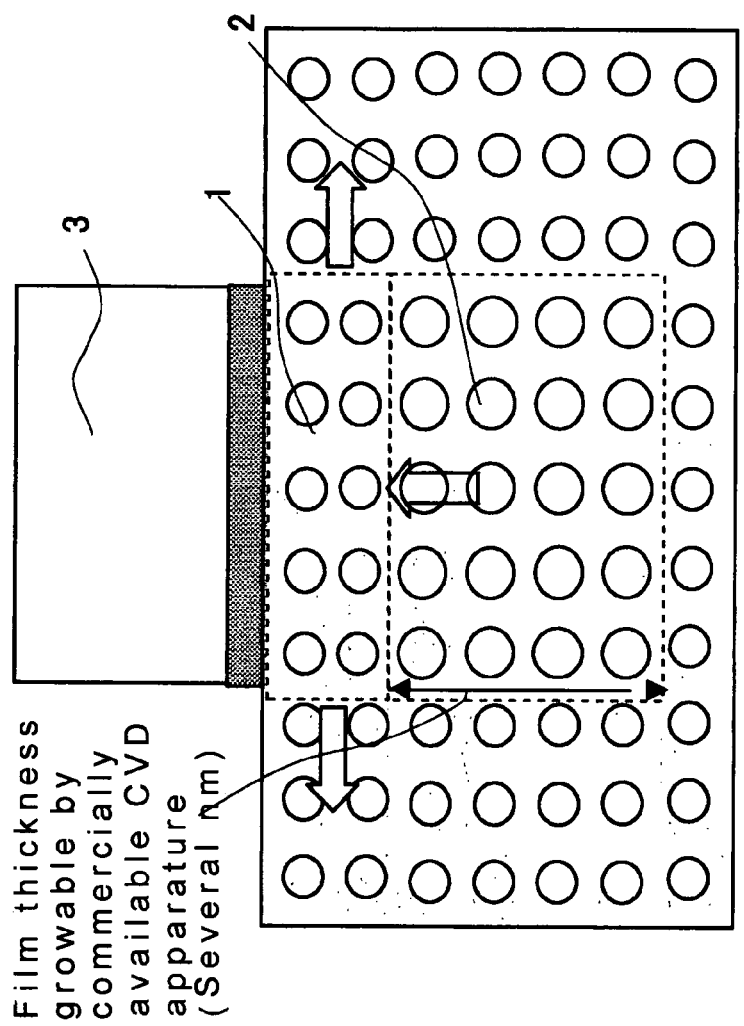
FIG. 1 is a diagram showing a structure of an Si substrate in which SiGe is embedded immediately below a channel.
Figure 2:
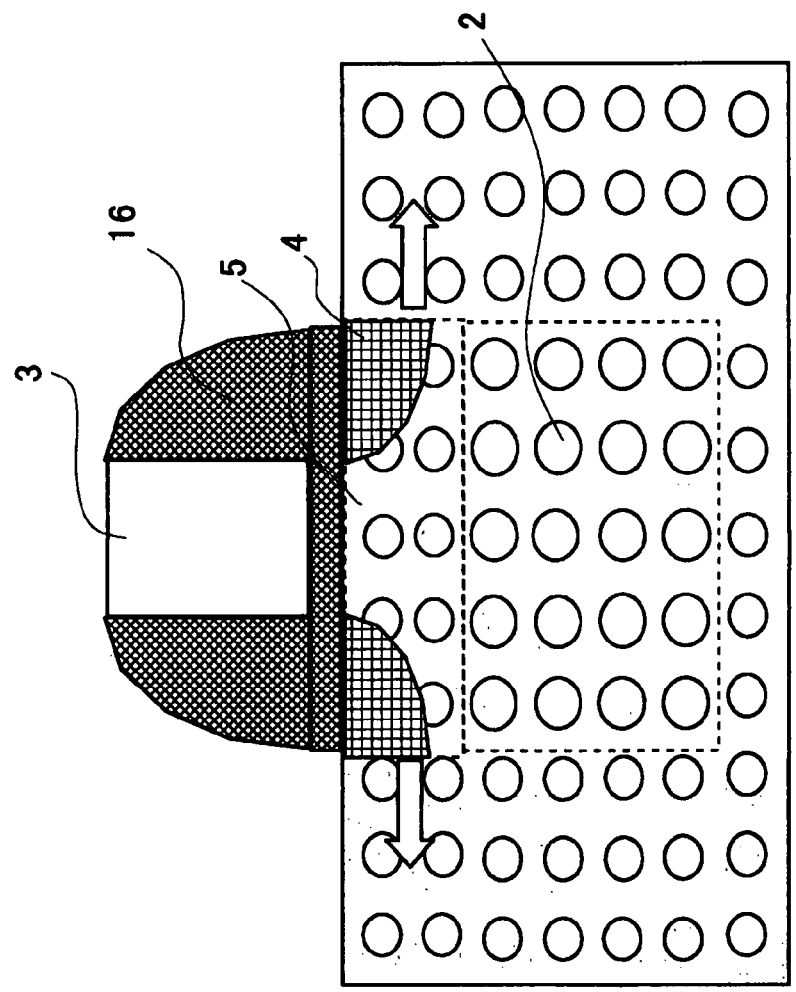
FIG. 2 is a diagram showing a structure in which a sidewall and a parasitic resistance region are further provided in the structure shown in FIG. 1.

FIG. 1 is a diagram showing a structure of an Si substrate in which SiGe is embedded immediately below a channel. As a stressor, SiGe having a large lattice constant is embedded immediately below the channel within a region of a gate electrode, and thus, SiGe is lattice matched to Si existing therearound in both horizontal and vertical directions. Film thickness of an SiGe stressor 2 formed herein is several nanometers (nm) that can be grown by a commercially available CVD apparatus. Therefore, it is possible to effectively apply compression distortion in the vertical direction and strain distortion in the horizontal direction to an Si channel layer 1 above the SiGe stressor 2. This particularly contributes to improvement of electron mobility in an nMOS. FIG. 2 is a diagram showing a structure in which a sidewall and a parasitic resistance region are further provided in the structure shown in FIG. 1. A sidewall 16 is formed on the gate electrode, and the SiGe stressor 2 is formed within a region of the sidewall 16. Moreover, by arranging a parasitic resistance region 4 under the sidewall 16, it is possible to apply distortion even to the parasitic resistance region 4, thereby reducing parasitic resistance.

Figure 3:
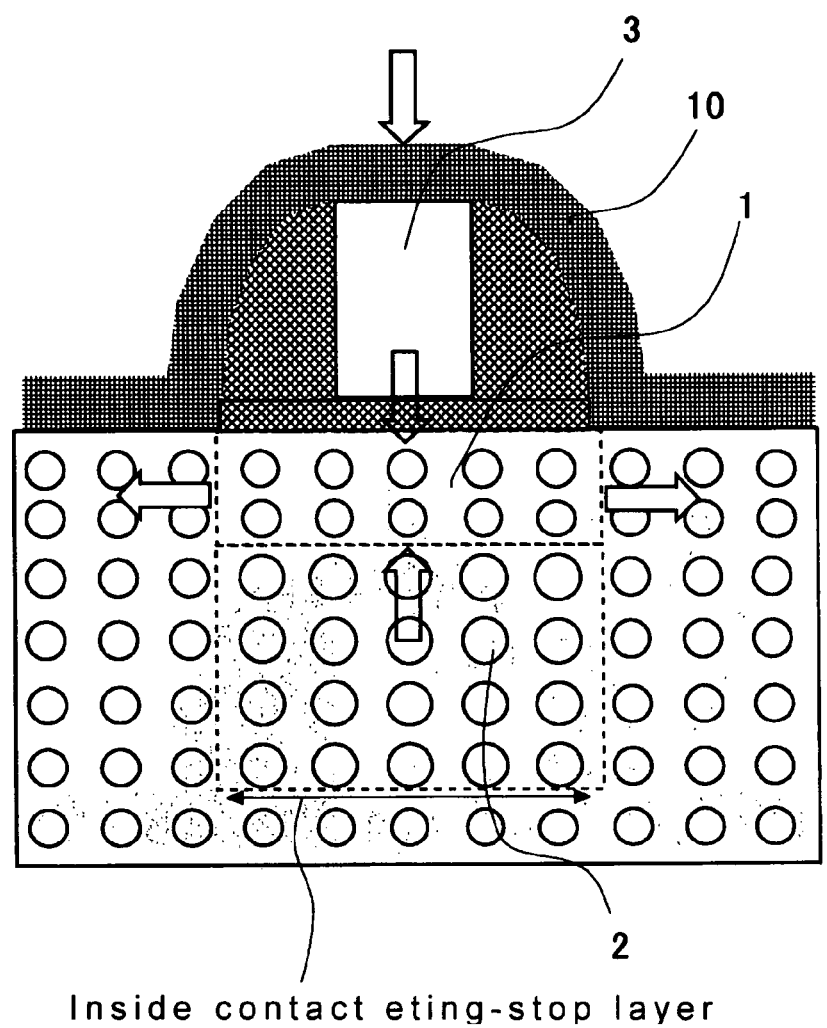
FIG. 3 is a diagram showing a combination of a contact etching-stop layer with the structure shown in FIGS. 1 and 2.

FIG. 3 is a diagram showing a combination of a contact etching-stop layer with the structure shown in FIGS. 1 and 2. A contact etching-stop layer 10 has, for example, an SiN layer ("tensile SiN" or "tensile stress layer") having a stress, and the structure shown in FIG. 3 is a combination therewith. By providing the SiGe stressor 2 within the contact etching-stop layer 10, the SiGe stressor and the tensile SiN 10 complementarily apply a compression stress in the vertical direction to the channel Si layer to cause the strain distortion in the horizontal direction, thereby easily improving electron mobility in the nMOS. In addition, by providing the SiGe stressor 2 within the contact etching-stop layer 10, without drastically changing the existing manufacturing process, it is possible to drastically improve the electron mobility and to introduce large distortion to the channel at a low cost.

Figure 4:
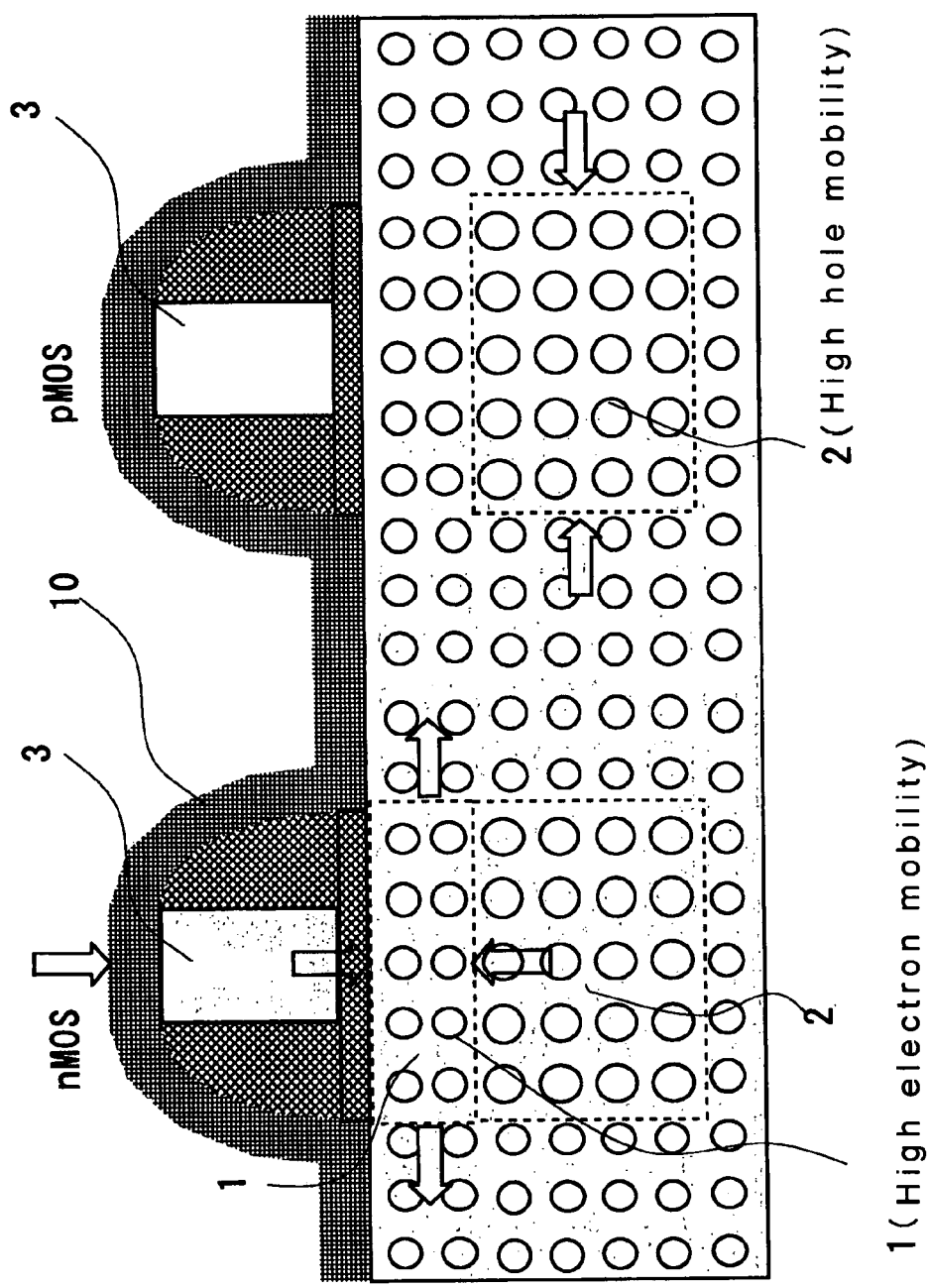
FIG. 4 is a diagram showing a configuration of a CMOS field-effect transistor according to the present invention.

FIG. 4 is a diagram showing a configuration of a CMOS field-effect transistor according to the present invention. In a pMOS field-effect transistor having the structure shown in FIGS. 1 to 3, the distorted Si layer 1 above the SiGe stressor 2 is formed in thickness that more holes exist on a side of the SiGe stressor 2 rather than on a side of the distorted Si layer 1 when a negative bias is applied to the gate because of discontinuity of band of Si/SiGe, thereby forming a channel in the SiGe layer 2. For example, the distorted Si layer 1 is formed in thickness of 4 nm, and the SiGe layer 2 is formed in thickness of approximately 4 nm. The CMOS field-effect transistor shown in FIG. 4 is manufactured by integrating the above pMOS field-effect transistor and the above nMOS field-effect transistor in which electrons exist in the distorted Si layer 1.

Figure 5:
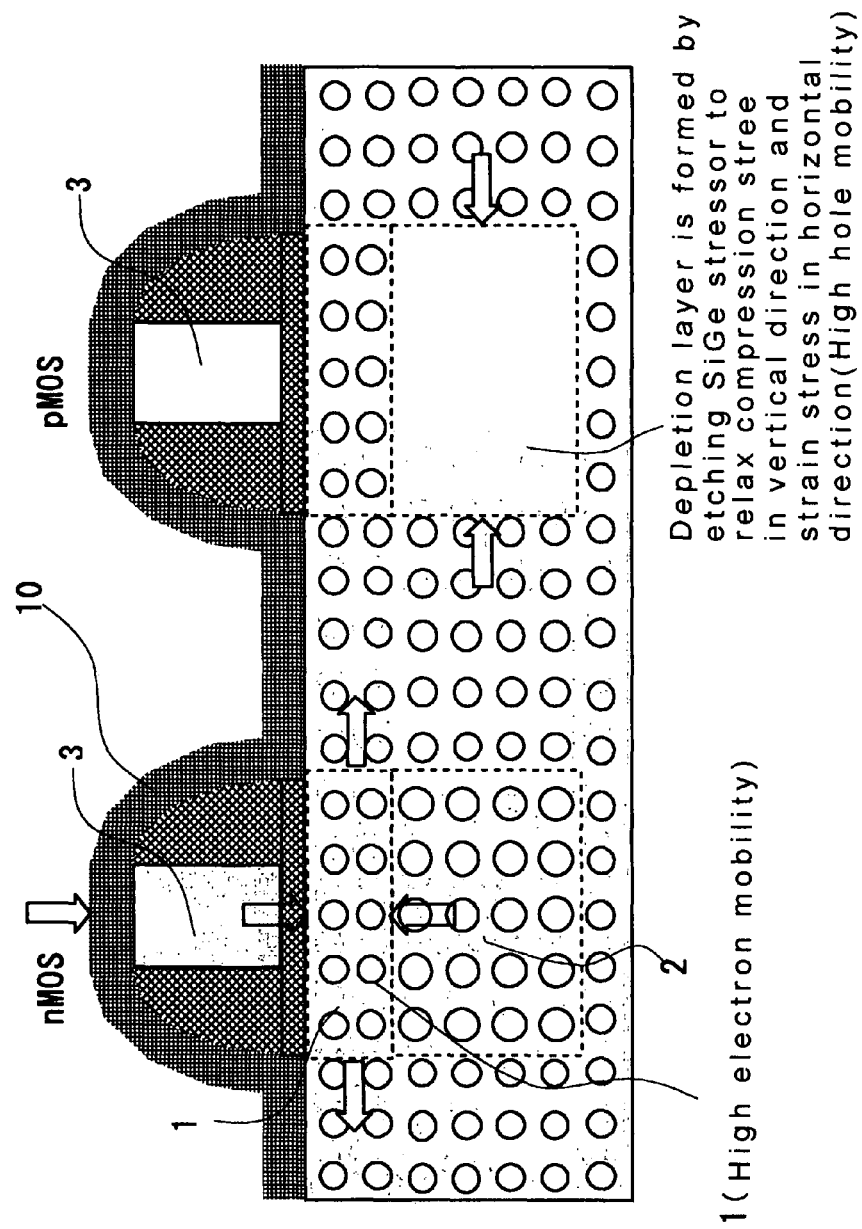
FIG. 5 is a diagram showing a configuration of a CMOS field-effect transistor according to the present invention.

FIG. 5 is a diagram showing a configuration of a CMOS field-effect transistor according to the present invention. In the pMOS field-effect transistor having the structure shown in FIGS. 1 to 3, the SiGe stressor 2 is removed by etching. Thus, the strain distortion in a lateral direction is relaxed, and deterioration of hole mobility is suppressed. The CMOS field-effect transistor shown in FIG. 5 is manufactured by integrating the above pMOS field-effect transistor and the above nMOS field-effect transistor in which electrons exist in the distorted Si layer 1.

EXAMPLES

The present invention will be described below in detail by way of examples. Note that the invention is not limited to the examples.

First Example

Figure 6:
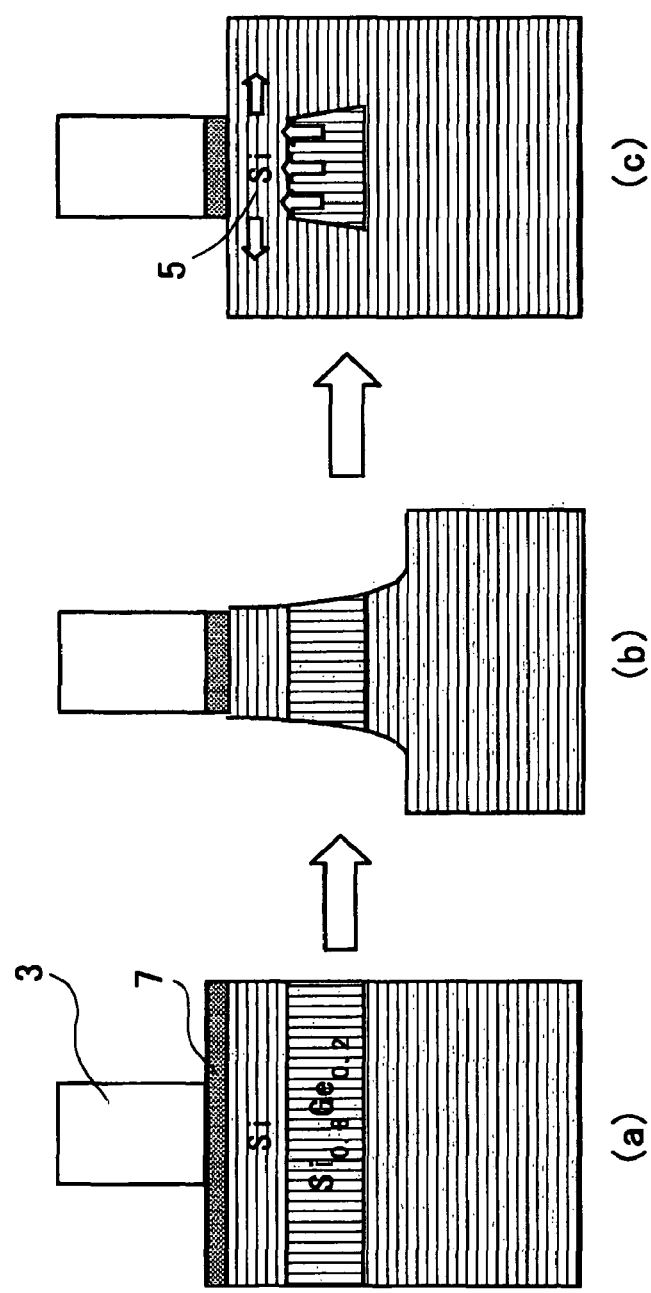
FIGS. 6A to 6C are diagrams showing a manufacturing process of the nMOS field-effect transistor according to a first example, where
Figure 7:
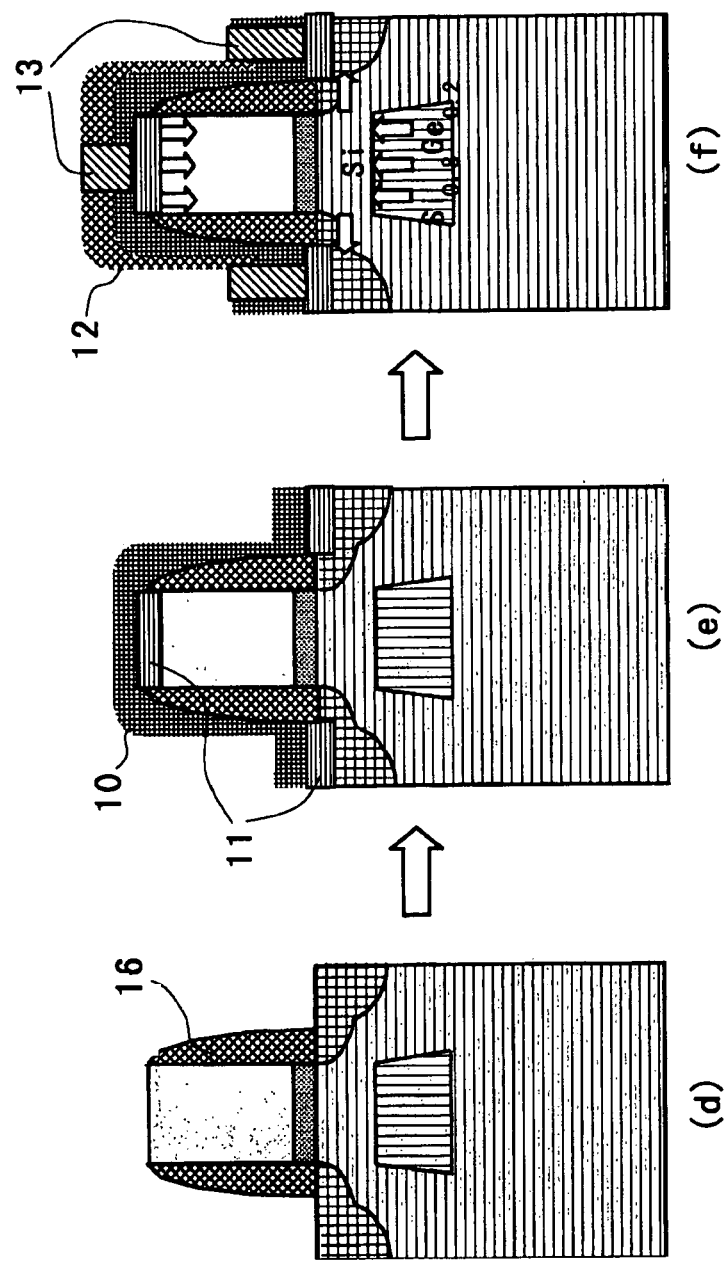
FIGS. 7D to 7F are diagrams showing a manufacturing process of the nMOS field-effect transistor according to the first example, where

FIGS. 6A to 6C and FIGS. 7D to 7F are diagrams showing a manufacturing process of the nMOS field-effect transistor according to a first example. FIG. 6A shows a state where a gate insulating film and a gate electrode are formed in the Si/SiGe layer structure. FIG. 6B shows a state where a source/drain region is etched. FIG. 6C shows a state where Si is filled back by the CVD. FIG. 7D shows a state where a sidewall is formed after extension is implanted. FIG. 7E shows a state where a contact etching-stop layer is formed. FIG. 7F shows a state where an interlayer insulating film is formed, a contact hole is opened, and an electrode is formed.

After completion of a device separation process in manufacture of a semiconductor device, as shown in FIGS. 6A to 6C, an Si/SiGe layer structure is selectively formed in an active region; further, a gate insulating film (SiON) 7 and a polysilicon gate electrode 3 are formed. Subsequently, masking the gate electrode 3, a source/drain region is etched, and then, Si is filled back by the CVD. Thus, the Si substrate which has a structure that the SiGe layer 2 is arranged only below the gate electrode 3 can be obtained. As shown in FIGS. 7D to 7F, then, the sidewall 16 is once removed; after a punch-through stopper and extension are implanted, the sidewall 16 is formed, and implantation in the source/drain region is performed. The implanted ions are activated by activation annealing, and then, for example, NiSi is formed as silicide 11. Further, for example, an SiN layer having a strain stress is formed thereover as the contact etching-stop layer 10. Subsequently, an interlayer insulating film 12 is formed, the contact hall is opened, and the electrode is formed.

Thus, the in-plane strain stress can be synergistically applied to the Si channel with the embedded SiGe stressor 2 and the contact etching-stop layer 10, thereby enabling manufacture of a MOS field-effect transistor of high mobility.

Second Example

Figure 8:
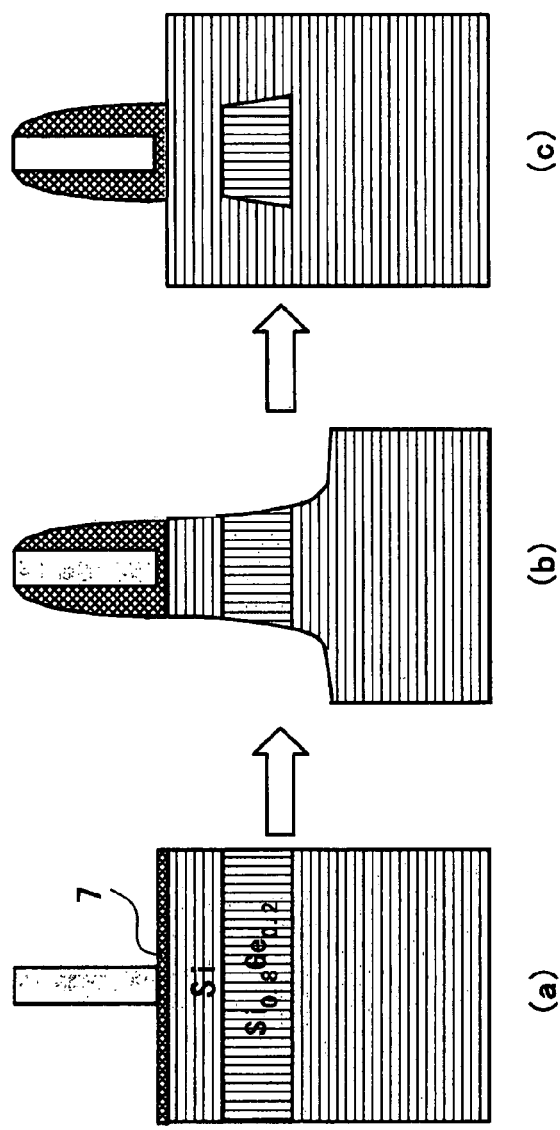
FIGS. 8A to 8C are diagrams showing a manufacturing process of the nMOS field-effect transistor according to a second example, where
Figure 9:
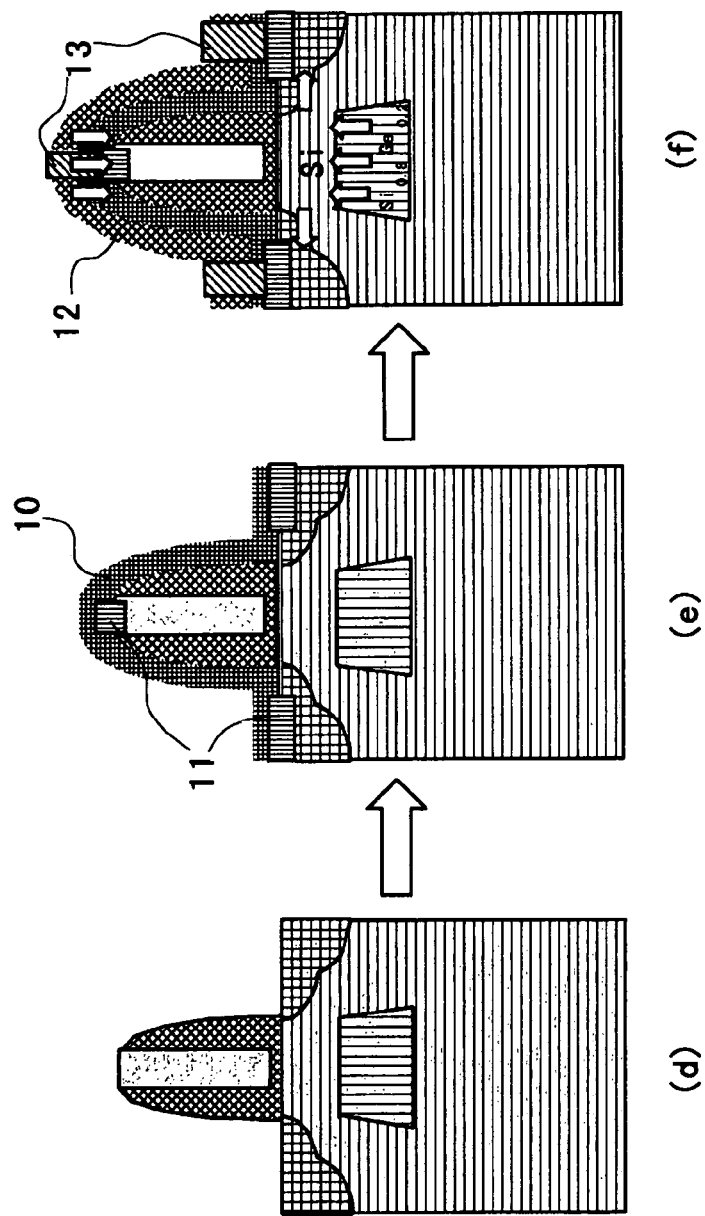
FIGS. 9D to 9F are diagrams showing a manufacturing process of the nMOS field-effect transistor according to the second example, where

FIGS. 8A to 8C and FIGS. 9D to 9F are diagrams showing a manufacturing process of the nMOS field-effect transistor according to a second example. FIG. 8A shows a state where the gate insulating film and the gate electrode are formed in the Si/SiGe layer structure. FIG. 8B shows a state where the source/drain region is etched, using the gate and the sidewall as a mask. FIG. 8C shows a state where Si is filled back by the CVD. FIG. 9D shows a state where the sidewall is formed after extension is implanted. FIG. 9E shows a state where a contact etching-stop layer is formed over the silicide. FIG. 9F shows a state where the interlayer insulating film is formed, the contact hole is opened, and the electrode is formed.

After completion of the device separation process in manufacture of a semiconductor device, as shown in FIGS. 8A to 8C, the Si/SiGe layer structure is selectively formed in an active region; further, the gate insulating film (SiON) 7, the polysilicon gate electrode 3, and the sidewall 16 are formed.

Subsequently, using the gate electrode 3 and the sidewall 16 as a mask, a source/drain region is etched, and then, Si is filled back by the CVD.

Thus, a structure that the SiGe stressor 2 is arranged in the silicon layer below the gate electrode and the sidewall can be obtained. In addition, while in the MOS field-effect transistor manufactured in the first example, if the gate insulating film 7 is thin, the gate electrode 3 and the silicon layer filled back by the CVD in the source/drain region contact each other, leading to a reduced yield, in the MOS field-effect transistor according to the second example, the sidewall 16 is inserted therebetween, thereby drastically improving the yield.

As shown in FIGS. 9D to 9F, then, the sidewall 16 is once removed; after a punch-through stopper and extension are implanted, the sidewall 16 is formed, and implantation in the source/drain region is performed. The implanted ions are activated by activation annealing, and then, for example, NiSi is formed as the silicide 11. For example, an SiN layer having a strain stress is formed thereover as the contact etching-stop layer 10. Further, the interlayer insulating film 12 is formed, the contact hall is opened, and the electrode 13 is formed.

Thus, the in-plane strain stress can be synergistically applied to the Si channel with the embedded SiGe stressor 2 and the contact etching-stop layer 10, thereby enabling manufacture of a MOS field-effect transistor of high mobility.

Third Example

In a third example, a method of adjusting an aspect ratio of the SiGe layer in order to balance the properties among the nMOS field-effect transistor and the pMOS field-effect transistor manufactured in the first and the second examples is provided.

Figure 10:
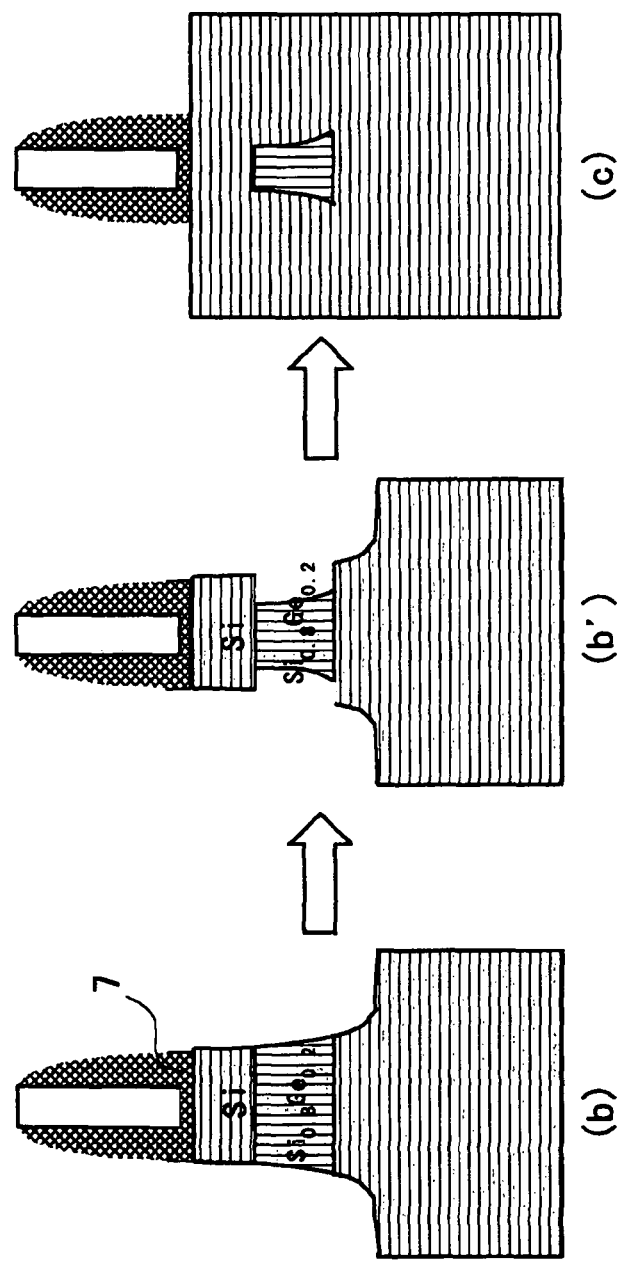
FIGS. 10B, 10B', and 10C are diagrams showing the method of adjusting an aspect ratio of the SiGe layer, where
FIG. 10C shows a state where Si is filled back into a portion that has been etched.

FIGS. 10B, 10B' and 10C are diagrams showing the method of adjusting an aspect ratio of the SiGe stressor. FIG. 10B shows a state where the source/drain region is etched, using the gate and the sidewall as a mask. FIG. 10B' shows a state where a part of the SiGe layer is selectively etched. FIG. 10C shows a state where Si is filled back into a portion that has been etched.

In the method of adjusting the aspect ratio of the SiGe stressor 2 in silicon by etching the sour/drain region using the gate and the sidewall as a mask, as shown in FIGS. 10B, 10B', and 10C, after the source/drain region is etched using the sidewall 16 as a mask, a part of the SiGe stressor 2 is selectively etched with, for example, a chlorine-series gas, and then, Si is filled back with the CVD. Thus, the aspect ratio of the SiGe stressor 2 is easily adjusted.

Fourth Example

In a fourth example, a CMOS field-effect transistor having the structure shown in FIG. 4 is manufactured. After completion of the device separation process in manufacture of a semiconductor device, the Si/SiGe layer structure is selectively formed in an active region such that the SiGe stressor 2 becomes a p-channel in a state where a negative voltage is applied to the gate electrode, and the Si layer 1 becomes a channel in a state where a positive voltage is applied to the gate electrode. The Si layer 1 and the SiGe layer 2 are layered so as to each have thickness of approximately 4 nm, for example. The heterojunction of the Si/SiGe layer is formed when an energy gap is small in a conducive band and large in a valence band. Subsequently, as shown in FIG. 8, the gate insulating film (SiON) 7, the polysilicon gate electrode 3, and the sidewall 16 are formed. Thereafter, using the polysilicon gate electrode 3 and the sidewall 16 as a mask, the source/drain region is etched, and then, Si is filled back by the CVD. Thus, a structure that the SiGe layer 2 is arranged in the silicon layer below the gate electrode 3 and the sidewall 16 can be obtained. After the sidewall 16 is once removed and a punch-through stopper and extension are implanted in each of regions at which nMOS and pMOS are to be formed, as shown in FIGS. 9D to 9F, the sidewall 16 is formed again, and implantation in the source/drain region is performed. The implanted ions are activated by activation annealing, and then, for example, NiSi is formed as the silicide 11. For example, an SiN layer having a strain stress is formed thereover as the contact etching-stop layer 10. The interlayer insulating film 12 is then formed, the contact hall is opened, and the electrode 13 is formed.

Thus, in the nMOS, the in-plane strain stress can be synergistically applied to the Si channel with the embedded SiGe layer 2 and the contact etching-stop layer 10, while in the pMOS, the channel can be formed with the SiGe layer 2 having high hole mobility, thereby enabling manufacture of a high-speed CMOS field-effect transistor.

Fifth Example

Figure 11:
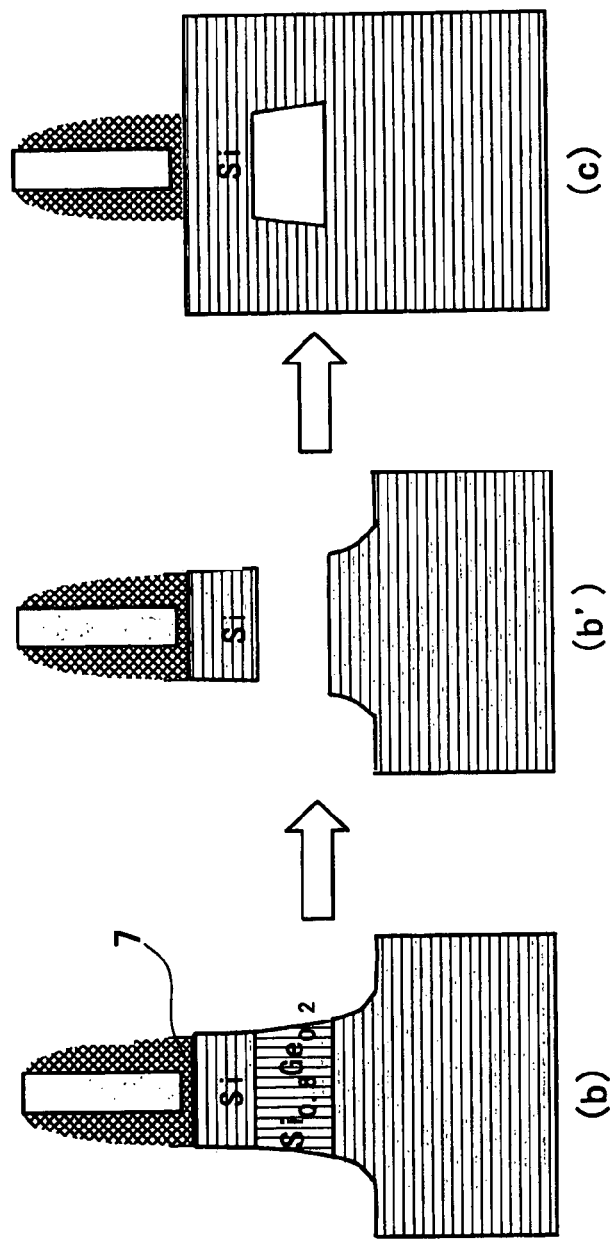
FIGS. 11B, 11B', and 11C are diagrams showing a manufacturing process of the pMOS field-effect transistor, where
FIG. 11C shows a state where Si is filled back.

In a fifth example, a CMOS field-effect transistor having the structure shown in FIG. 5 is manufactured. FIGS. 11B, 11B', and 11C are diagrams showing a manufacturing process of the pMOS field-effect transistor. FIG. 11B shows a state where the source/drain region is etched. FIG. 11B' shows a state where the SiGe layer is removed by selective etching. FIG. 11C shows a state where Si is filled back.

After completion of the device separation process in manufacture of a semiconductor device, as shown in FIG. 8A, the Si/SiGe layer structure is selectively formed in an active region; further, the gate insulating film (SiON) 7, the polysilicon gate electrode 3, and the sidewall 16 are formed. Subsequently, as shown in FIG. 11B, the source/drain region is etched using the gate electrode 3 and the sidewall 16 as a mask. A region of the nMOS is then covered with resist, and as shown in FIG. 11B', the SiGe layer 2 in a region of the pMOS is removed by selective etching. Thereafter, the resist is removed, and as shown in FIG. 11C, Si is filled back with the CVD in both the regions of nMOS and the pMOS. Thus, a structure that the SiGe layer 2 is arranged in the region of the nMOS below the gate electrode 3 and the sidewall 16 can be obtained. After the sidewall 16 is once removed and a punch-through stopper and extension are implanted in each of the regions at which the nMOS and the pMOS are formed, as shown in FIG. 9D, the sidewall 16 is formed again, and implantation in the source/drain region is performed. The implanted ions are activated by activation annealing, and then, for example, NiSi is formed as the silicide 11. As shown in FIG. 9E, for example, an SiN layer 10 having a strain stress is formed thereover as the contact etching-stop layer 10. Sequentially, as shown in FIG. 9F, the interlayer insulating film 12 is formed, the contact hall is opened, and the electrode 13 is formed.

As shown in FIG. 5, only in the nMOS, the in-plane strain stress can be synergistically applied to the Si channel with the embedded SiGe layer 2 and the contact etching-stop layer 10, while in the pMOS, the distortion generated by the SiGe layer 2 and the contact etching-stop layer 10 can be relaxed by removing the SiGe layer 2, thereby enabling manufacture of a high-speed CMOS field-effect transistor in which the hole mobility is improved.

By the manufacturing method of the MOS field-effect transistor according to the present invention, the mobility of electrons or holes can be drastically improved by applying the structure in which SiGe having a large lattice constant is embedded immediately below the channel to effectively introduce distortion in the channel Si layer. Thus, the manufacturing method of a MOS field-effect transistor with which a high-speed operation and low power consumption are realized can be provided.

Moreover, by this manufacturing method of the MOS field-effect transistor, it is possible to provide a MOS field-effect transistor that is advantageous in terms of costs, maintaining high consistency with existing processes without drastically changing the processes.

What is claimed is:

1. A manufacturing method of a MOS field-effect transistor, comprising steps of:
    forming a stressor composed of a compound having a lattice constant different from that of silicon in a portion inside an active region that is separated by an insulating film formed on a silicon substrate;
    forming a silicon channel layer formed with silicon above the stressor; wherein the stressor is formed in the active region that is separated by the insulating film formed inside the silicon substrate;
    forming a tensile stress layer so as to surround a gate electrode and a sidewall formed on the gate electrode, wherein the stressor is formed inside the tensile stress layer;
    etching the silicon channel layer and said stressor in a source/drain region of the MOS field-effect transistor;
    removing the remaining silicon stressor directly under the silicon channel layer to form a depletion area; and
    filling back a portion that has been etched, with silicon by chemical vapor deposition, the portion except the depletion area.

2. The manufacturing method of a MOS field-effect transistor according to claim 1, wherein the stressor is formed in a self-aligning manner only immediately below a region inside an end of a sidewall that is formed on a gate electrode.

3. The manufacturing method of a MOS field-effect transistor according to claim 1, wherein the stressor is formed in a self-aligning manner only immediately below a region of a gate electrode.

4. The manufacturing method of a MOS field-effect transistor according to any one of claims 1 to 3, wherein silicon germanium is formed as the stressor.

5. The manufacturing method of a MOS field-effect transistor according to claim 4, wherein film thickness of the silicon germanium is thicker than the silicon channel layer there above.

6. A manufacturing method of a CMOS field-effect transistor, wherein
    a manufacturing method of a pMOS field-effect transistor using the manufacturing method of a MOS field-effect transistor according to claim 1, and
    a manufacturing method of an nMOS field-effect transistor comprising steps of forming a stressor composed of a compound having a lattice constant different from that of silicon in a portion inside an active region that is separated by an insulating film formed on a silicon substrate; and forming a silicon channel layer formed with silicon above the stressor, are performed.

7. The manufacturing method of a CMOS field-effect transistor according to claim 6, comprising steps of
    etching the silicon channel layer/stressor in the source/drain region of the nMOS field-effect transistor; and
    filling back a portion in the source/drain region of the nMOS field-effect transistor that has been etched, with silicon by chemical vapor deposition.

8. A manufacturing method of a CMOS field-effect transistor, comprising
    a manufacturing method of a pMOS field-effect transistor comprising
    forming a stressor composed of a compound having a lattice constant different from that of silicon in a portion inside an active region that is separated by an insulating film formed on a silicon substrate;
    forming a silicon channel layer formed with silicon above the stressor; wherein the stressor is formed in the active region that is separated by the insulating film formed inside the silicon substrate;
    forming a tensile stress layer so as to surround the gate electrode and the sidewall formed on the gate electrode, wherein the stressor is formed inside the tensile stress layer;
    a manufacturing method of an nMOS field-effect transistor comprising steps of forming a stressor composed of a compound having a lattice constant different from that of silicon in a portion inside an active region that is separated by an insulating film formed on a silicon substrate; and forming a silicon channel layer formed with silicon above the stressor, are performed;
    etching said silicon channel layer and said stressor in a source/drain region of the pMOS field-effect transistor;
    removing the remaining silicon stressor directly under the silicon channel layer to form a depletion area; and
    filling back a portion that has been etched, with silicon by chemical vapor deposition, the portion except the depletion layer.

* * * * *